United States Patent
Hsiao et al.

(10) Patent No.: US 10,868,387 B2
(45) Date of Patent: Dec. 15, 2020

(54) HIGH SPEED WIRE END CONNECTOR AND MANUFACTURING METHOD THEREOF

(71) Applicant: BizLink International Corp., New Taipei (TW)

(72) Inventors: Hsin-Tuan Hsiao, New Taipei (TW); Jui-Hung Chien, New Taipei (TW)

(73) Assignee: BizLink International Corp., New Taipei (TW)

(*) Notice: Subject to any disclaimer, the term of this patent is extended or adjusted under 35 U.S.C. 154(b) by 0 days.

(21) Appl. No.: 16/592,781

(22) Filed: Oct. 4, 2019

(65) Prior Publication Data
US 2020/0366025 A1    Nov. 19, 2020

(30) Foreign Application Priority Data
May 15, 2019   (TW) .............................. 108116787 A

(51) Int. Cl.
| | |
|---|---|
| H01R 13/50 | (2006.01) |
| H01R 13/504 | (2006.01) |
| H01R 12/62 | (2011.01) |
| H01R 24/60 | (2011.01) |
| H01R 43/20 | (2006.01) |
| H01R 43/24 | (2006.01) |
| H01R 43/02 | (2006.01) |
| H05K 1/11 | (2006.01) |
| H01R 107/00 | (2006.01) |

(52) U.S. Cl.
CPC ........... *H01R 13/504* (2013.01); *H01R 12/62* (2013.01); *H01R 24/60* (2013.01); *H01R 43/0256* (2013.01); *H01R 43/205* (2013.01); *H01R 43/24* (2013.01); *H01R 2107/00* (2013.01); *H05K 1/117* (2013.01)

(58) Field of Classification Search
CPC ...... H01R 13/504; H01R 12/62; H01R 24/60; H01R 43/0256
USPC .......................................................... 439/55
See application file for complete search history.

(56) References Cited

U.S. PATENT DOCUMENTS

| | | | | |
|---|---|---|---|---|
| 5,116,239 A | * | 5/1992 | Siwinski ................ | H01R 43/20 439/497 |
| 6,276,966 B1 | * | 8/2001 | Yamoto .............. | H01R 13/6594 439/607.13 |
| 7,207,832 B2 | * | 4/2007 | Liu .......................... | H01R 9/03 439/499 |

(Continued)

FOREIGN PATENT DOCUMENTS

| | | |
|---|---|---|
| CN | 101924296 A | 12/2010 |
| TW | M314939 U | 7/2007 |

(Continued)

*Primary Examiner* — Alexander Gilman
(74) *Attorney, Agent, or Firm* — CKC & Partners Co., LLC

(57) ABSTRACT

A high speed wire end connector manufacturing method includes the following steps. First, a cable is soldered to a printed circuit board, and then an inner film is formed to cover a portion of the cable and a portion of the printed circuit board by an insert molding process. Another portion of the printed circuit board is passed through a guide hole of an outer casing, and a molded bonding layer is formed by an outer molding process to bond to the outer casing and the inner film. In addition, a metal spring latch is fixed on the outer casing. In addition, a high speed wire end connector is also disclosed herein.

11 Claims, 7 Drawing Sheets

(56) References Cited

U.S. PATENT DOCUMENTS

| | | | | |
|---|---|---|---|---|
| 7,273,396 B2* | 9/2007 | Itano | H01R 13/506 | |
| | | | 439/404 | |
| 7,625,231 B2* | 12/2009 | Takahira | H01R 12/79 | |
| | | | 439/260 | |
| 7,667,655 B2* | 2/2010 | Inoue | H01Q 1/52 | |
| | | | 343/702 | |
| 7,824,219 B2* | 11/2010 | Wang | H01R 13/65802 | |
| | | | 439/607.27 | |
| 7,909,661 B2* | 3/2011 | Wu | H01R 12/721 | |
| | | | 439/701 | |
| 7,997,909 B2* | 8/2011 | Xu | H01R 13/6594 | |
| | | | 439/76.1 | |
| 8,174,117 B2* | 5/2012 | Ishido | H01L 23/3142 | |
| | | | 257/737 | |
| 8,282,412 B1* | 10/2012 | Yaguchi | H01R 13/5804 | |
| | | | 439/492 | |
| 8,439,706 B2* | 5/2013 | Sytsma | H01R 13/6582 | |
| | | | 439/607.46 | |
| 9,077,124 B2* | 7/2015 | Chen | H01R 12/721 | |
| 9,225,090 B2* | 12/2015 | Chen | H01R 12/79 | |
| 9,444,194 B2* | 9/2016 | Tanaka | H01R 13/6599 | |
| 9,485,892 B2* | 11/2016 | Nakata | H01B 7/08 | |
| 9,620,910 B2* | 4/2017 | Chen | H01R 13/6658 | |
| 10,096,944 B2* | 10/2018 | Huang | H01R 13/6582 | |
| 10,263,349 B2* | 4/2019 | Phillips | H01R 13/6335 | |
| 10,312,638 B2* | 6/2019 | Girard, Jr. | H01R 13/6599 | |
| 10,381,783 B2* | 8/2019 | Zhou | H01R 12/79 | |
| 10,476,189 B2* | 11/2019 | Tsubaki | H01R 12/774 | |
| 10,490,959 B2* | 11/2019 | Huang | H01R 24/62 | |
| 2012/0156900 A1* | 6/2012 | Wu | H01R 13/506 | |
| | | | 439/76.1 | |

FOREIGN PATENT DOCUMENTS

| | | |
|---|---|---|
| TW | M341972 U | 10/2008 |
| TW | M450846 U1 | 4/2013 |
| TW | 201438351 A | 10/2014 |
| TW | 201813216 A | 4/2018 |

* cited by examiner

HIGH SPEED WIRE END CONNECTOR AND MANUFACTURING METHOD THEREOF

RELATED APPLICATIONS

This application claims priority to Taiwan Application Serial Number 108116787, filed May 15, 2019, which is herein incorporated by reference.

TECHNICAL FIELD

The present disclosure generally relates to a wire end connector and manufacturing method thereof. More particularly, the present disclosure relates to a high speed wire end connector and manufacturing method thereof.

BACKGROUND

With the development and innovation of various high frequency electronic products, new high frequency electronic products require relatively more bandwidth. Therefore, the world today relies on the rapid and reliable information transmission.

In the electronic communication equipment for transferring large volumes of information, the wire-to-board connector is one kind of connector device widely used in electronic communication field, which includes a wire-end connector and a board-end connector. Normally, the board-end connector is mounted on a circuit board.

At present, in high-speed transmission devices, Slim Serial Attached Small Computer System Interface (Slim SAS) and Slim SAS Low Profile are widely used in the computer equipment of data centers, especially in the computer equipment such as servers, switches, storage and workstations.

However, the attenuation rate of the conventional Slim SAS transmission line is too high due to an excessive length of the circuit board in the connector, so that the transmission rate cannot be further increased. In addition, the structure of assembly type connectors for the Slim SAS Low Profile transmission line frequently differs in fit tolerances, resulting in connector positioning problems.

SUMMARY

One objective of the embodiments of the present invention is to provide a high speed wire end connector and manufacturing method thereof to increase the transmission rate and transmission quality for the high speed wire end connector.

To achieve these and other advantages and in accordance with the objective of the embodiments of the present invention, as the embodiment broadly describes herein, the embodiments of the present invention provides a high speed wire end connector manufacturing method, including the following steps. First, a cable is soldered on a printed circuit board. An inner film is formed to cover a portion of the cable and a portion of the printed circuit board by an insert molding process. Another portion of the printed circuit board passes through a guide hole of an outer casing. A molded bonding layer is formed to bond to the outer casing and the inner film by an outer molding process. In addition, the wire end connector manufacturing method further includes a step of fixing a metal spring latch on the outer casing.

In some embodiments, the step of passing another portion of the printed circuit board through a guide hole of an outer casing further includes a step of limiting the inner film with a plurality of limit protrusions of the outer casing. In addition, the molded bonding layer includes adhesive grooves formed at positions of the limit protrusions to bond to the limit protrusions.

In some embodiments, the molded bonding layer further includes adhesive bumps formed between the limit protrusions of the outer casing to bond to a plurality of adhesive recesses of the outer casing.

In some embodiments, the step of passing another portion of the printed circuit board through a guide hole of an outer casing further includes a step of fixing the inner film between a plurality of limit protrusions of the outer casing with at last one positioning pin.

In some embodiments, the outer casing further includes a plurality of adhesive lugs and the molded bonding layer further includes a plurality of adhesive grooves for bonding to corresponding adhesive lugs.

In some embodiments, the adhesive lugs further includes a plurality of openings, and the molded bonding layer further includes a plurality of adhesive bumps for bonding to corresponding openings.

In some embodiments, the molded bonding layer further includes at least one positioning hole exposing the inner film.

In another aspect according to the present invention, there is provided a high speed wire end connector including a printed circuit board, a cable, an inner film, an outer casing and a molded bonding layer. The cable is soldered on the printed circuit board, the inner film covers a portion of the cable and a portion of the printed circuit board, the outer casing fixes the printed circuit board, the cable and the inner film and another portion of the printed circuit board passes through a guide hole of the outer casing, and the molded bonding layer bonds the outer casing to the inner film.

In some embodiments, the high speed wire end connector further includes a metal spring latch fixing on the outer casing.

In some embodiments, the outer casing further includes a fixing tongue and the metal spring latch is fixed on the fixing tongue.

In some embodiments, the the outer casing further includes a U-shaped protection, and the U-shaped protection and the fixing tongue surround the printed circuit board.

In some embodiments, the outer casing further includes a plurality of limit protrusions to limit the inner film in the outer casing.

In some embodiments, the molded bonding layer includes a plurality of adhesive grooves to bond to corresponding limit protrusions.

In some embodiments, the outer casing further includes a plurality of adhesive recesses formed between the limit protrusions to bond to adhesive bumps of the molded bonding layer.

In some embodiments, the limit protrusions include at least one first limit protrusion and at least one second limit protrusion corresponding to a first surface of the inner film, and the first surface of the inner film is parallel to a surface of the printed circuit board.

In some embodiments, the limit protrusions further include a third limit protrusion corresponding to a second surface of the inner film, and the second surface is perpendicular to the surface of the printed circuit board.

In some embodiments, the limit protrusions further include at least one fourth limit protrusion corresponding to a third surface of the inner film, and the third surface is perpendicular to the surface of the printed circuit board and the second surface.

In some embodiments, the outer casing further includes a plurality of adhesive lugs, and the molded bonding layer further includes a plurality of adhesive grooves to bond to corresponding adhesive lugs.

In some embodiments, the adhesive lugs further include openings and the molded bonding layer further includes a plurality of adhesive bumps to bond to corresponding openings.

In some embodiments, the molded bonding layer further includes at least one positioning hole to expose the inner film.

In some embodiments, the outer casing further includes a sliding channel to allow the printed circuit board sliding into the guide hole of the outer casing.

Hence, the high speed wire end connector manufacturing by the high speed wire end connector manufacturing method can provide an outer casing produced by plastic injection process to couple to the printed circuit board so that the length of the printed circuit board can be reduced and the positioning accuracy and water proof capability can be improved with the inner film, the molded bonding layer and the limit protrusions of the outer casing, the total product quality of the high speed wire end connector is also improved, and the transmission rate and the transmission quality of the high speed wire end connector are also improved.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
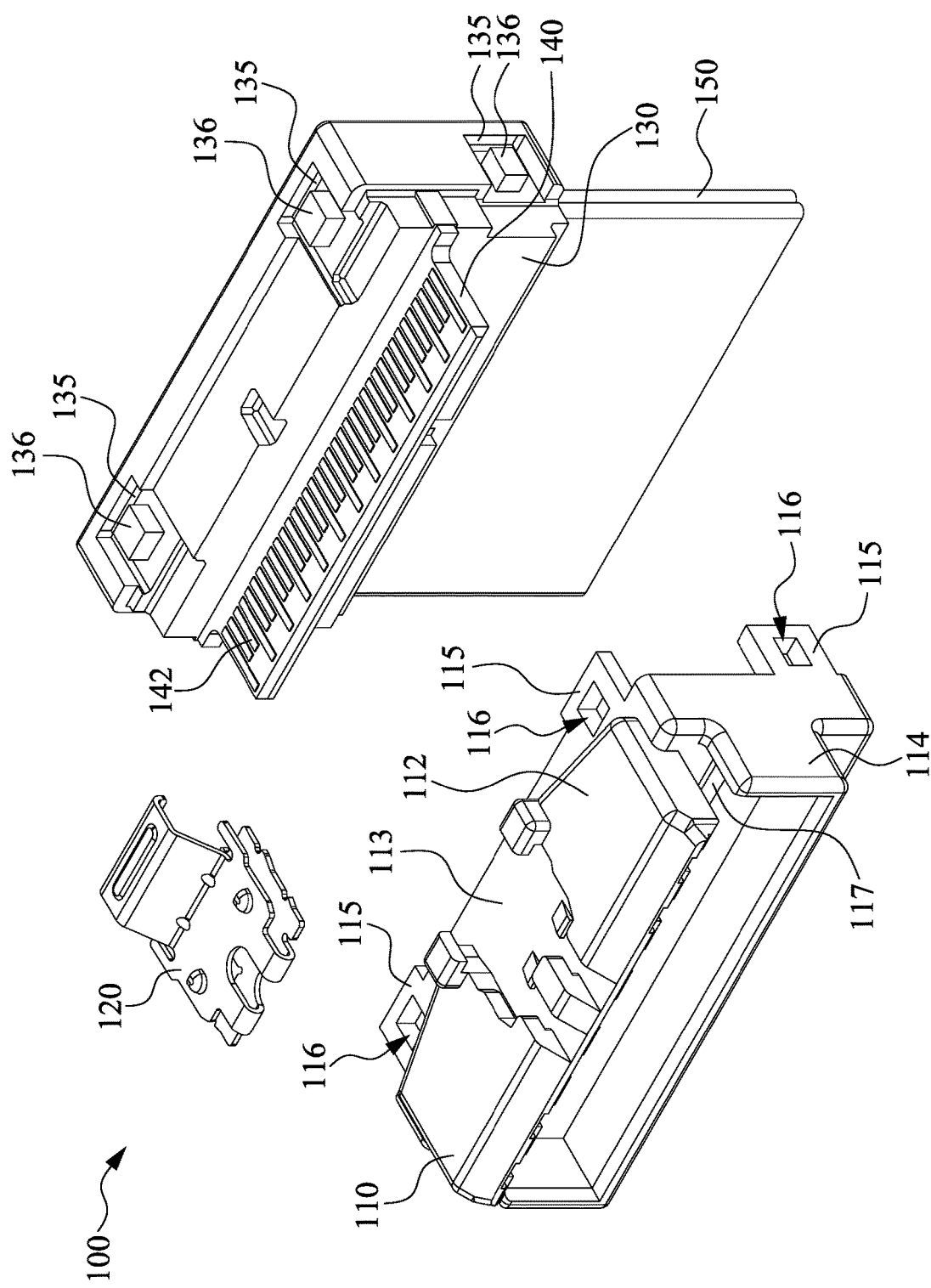
FIG. 1 illustrates a schematic perspective diagram showing a high speed wire end connector according to one embodiment of the present invention.
Figure 2:
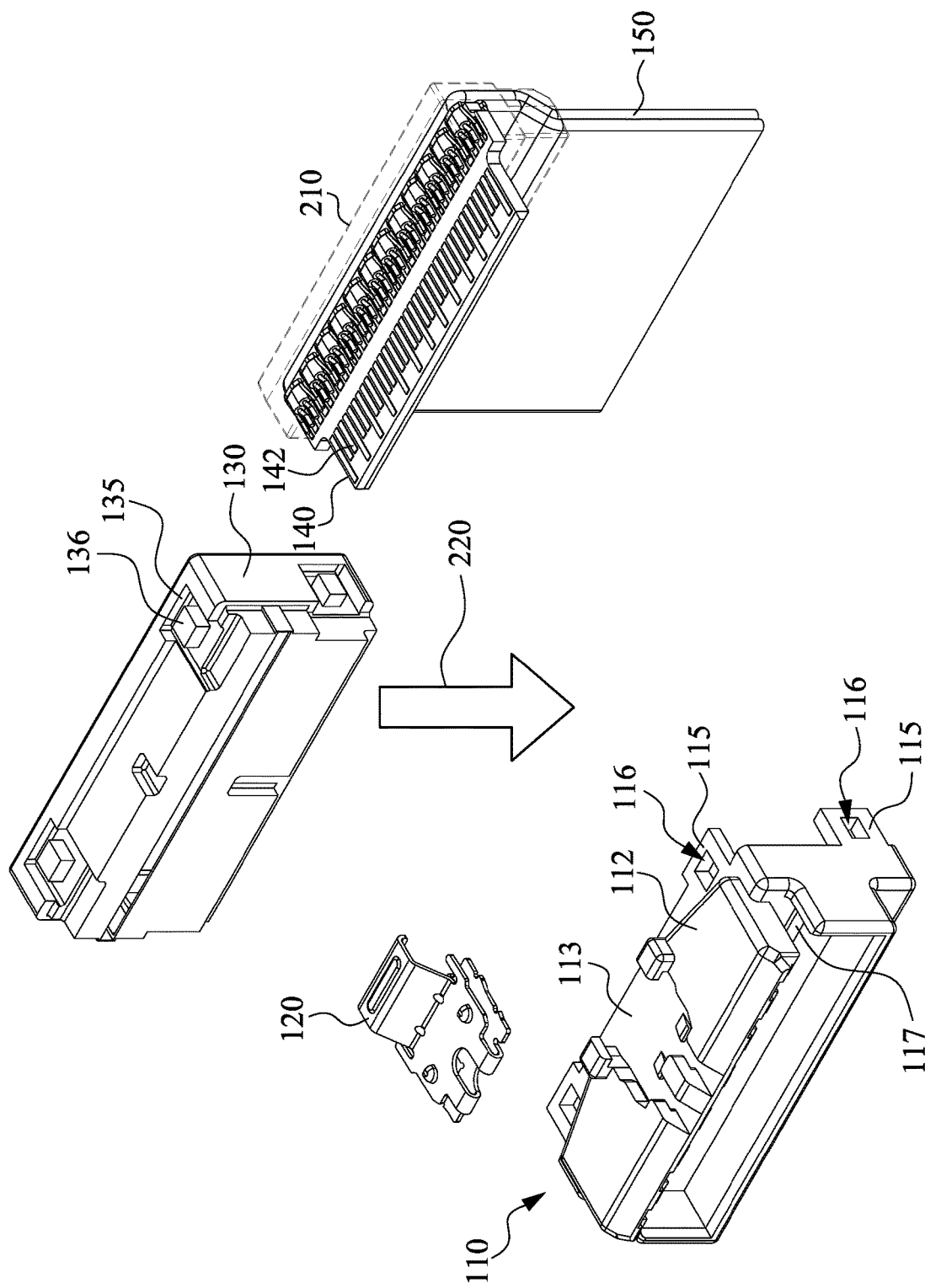
FIG. 2 illustrates an exploded diagram showing the high speed wire end connector according to one embodiment of the present invention.
Figure 3:
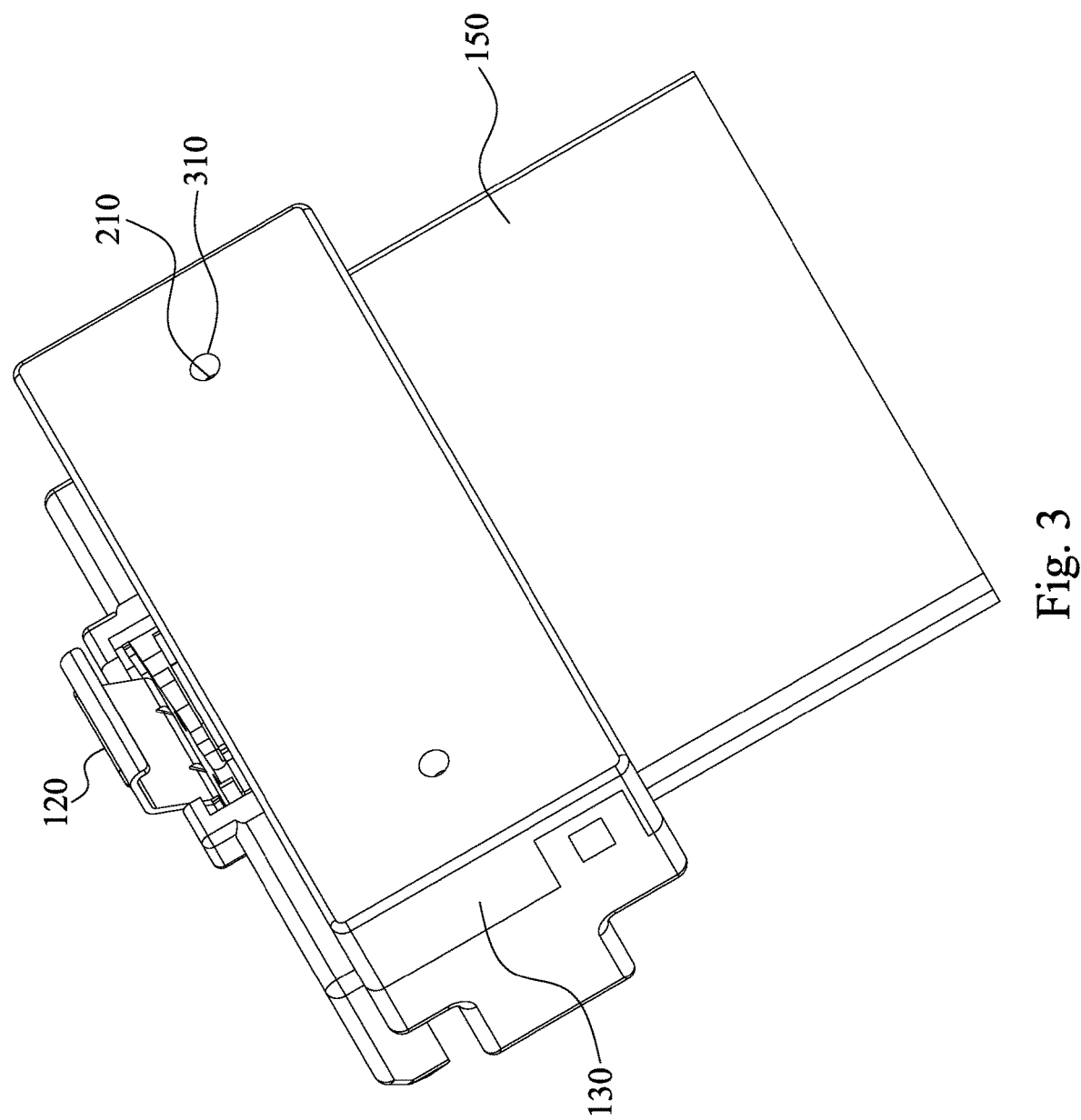
FIG. 3 illustrates a rear view of the high speed wire end connector according to one embodiment of the present invention.
Figure 4:
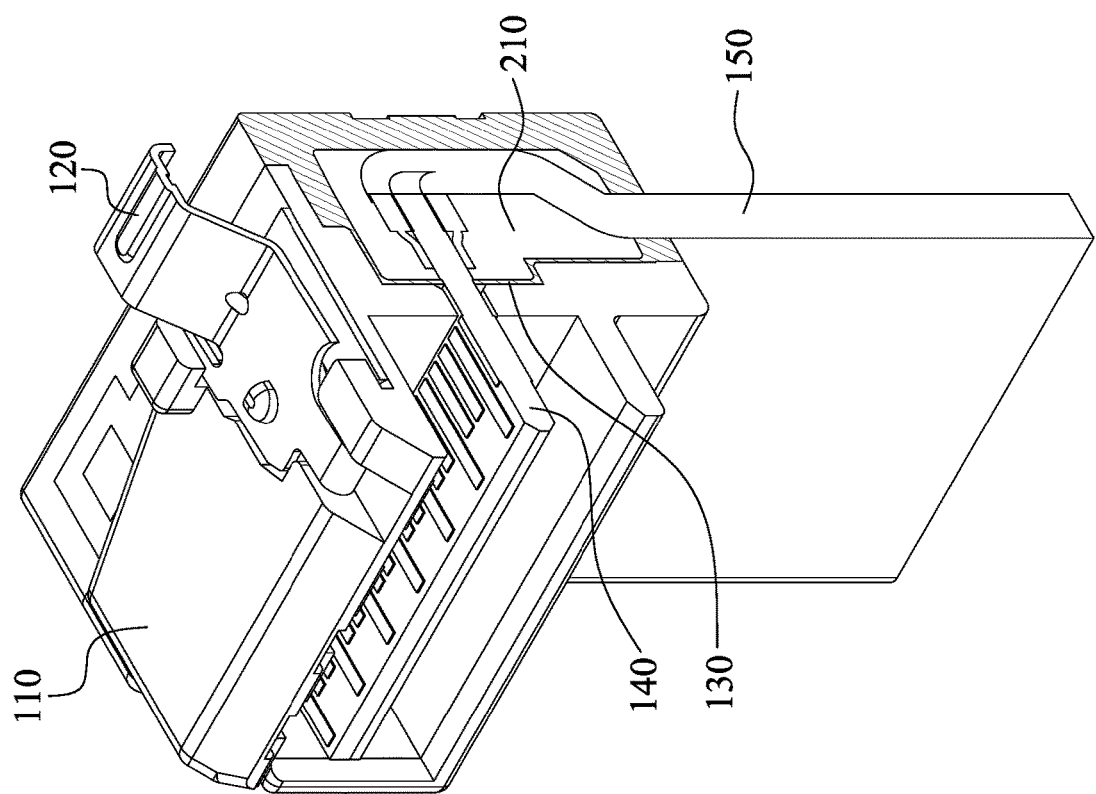
FIG. 4 illustrates a partial sectional view of the high speed wire end connector according to one embodiment of the present invention.
Figure 5:
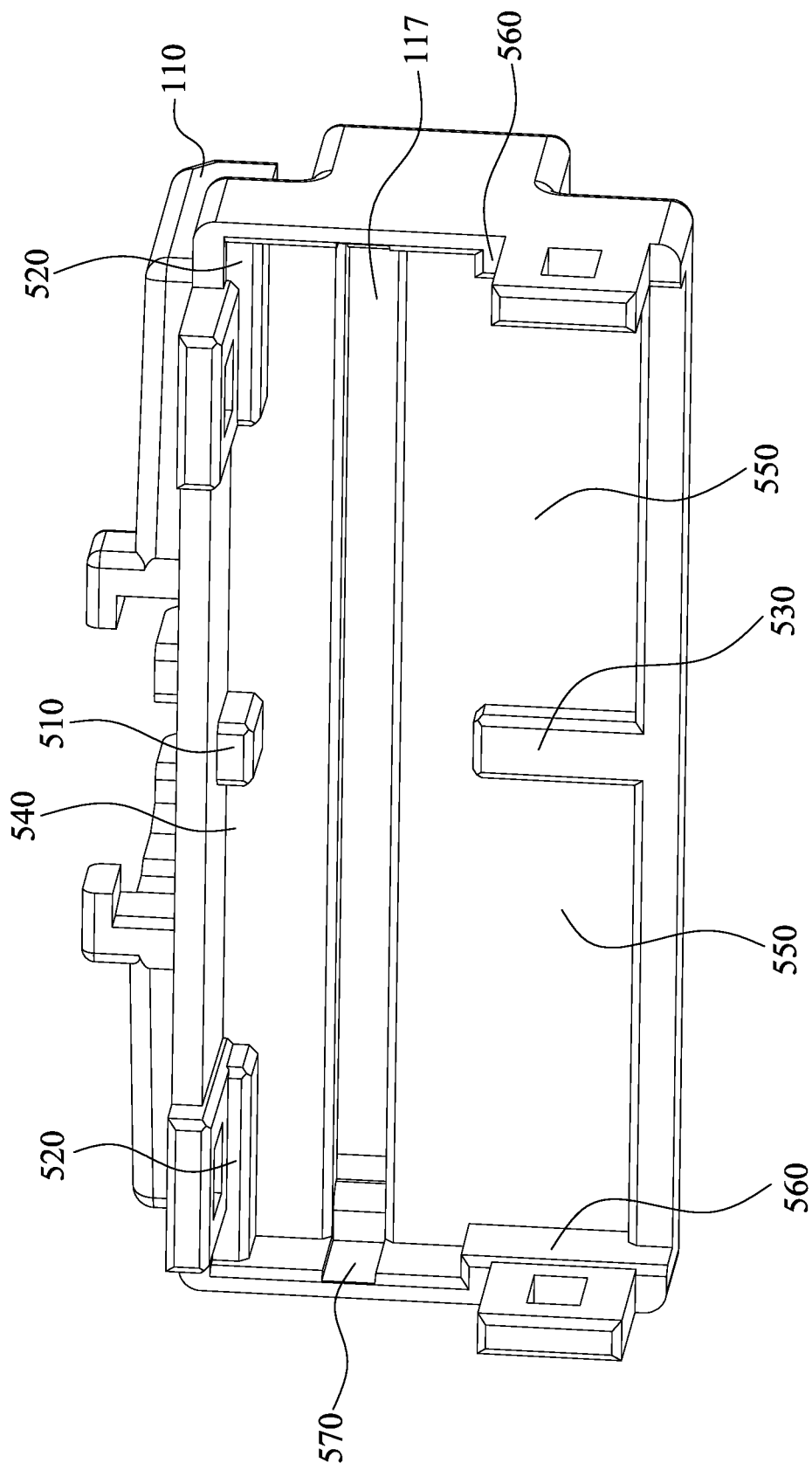
FIG. 5 illustrates a schematic perspective diagram showing an outer casing of the high speed wire end connector according to one embodiment of the present invention.
Figure 6:
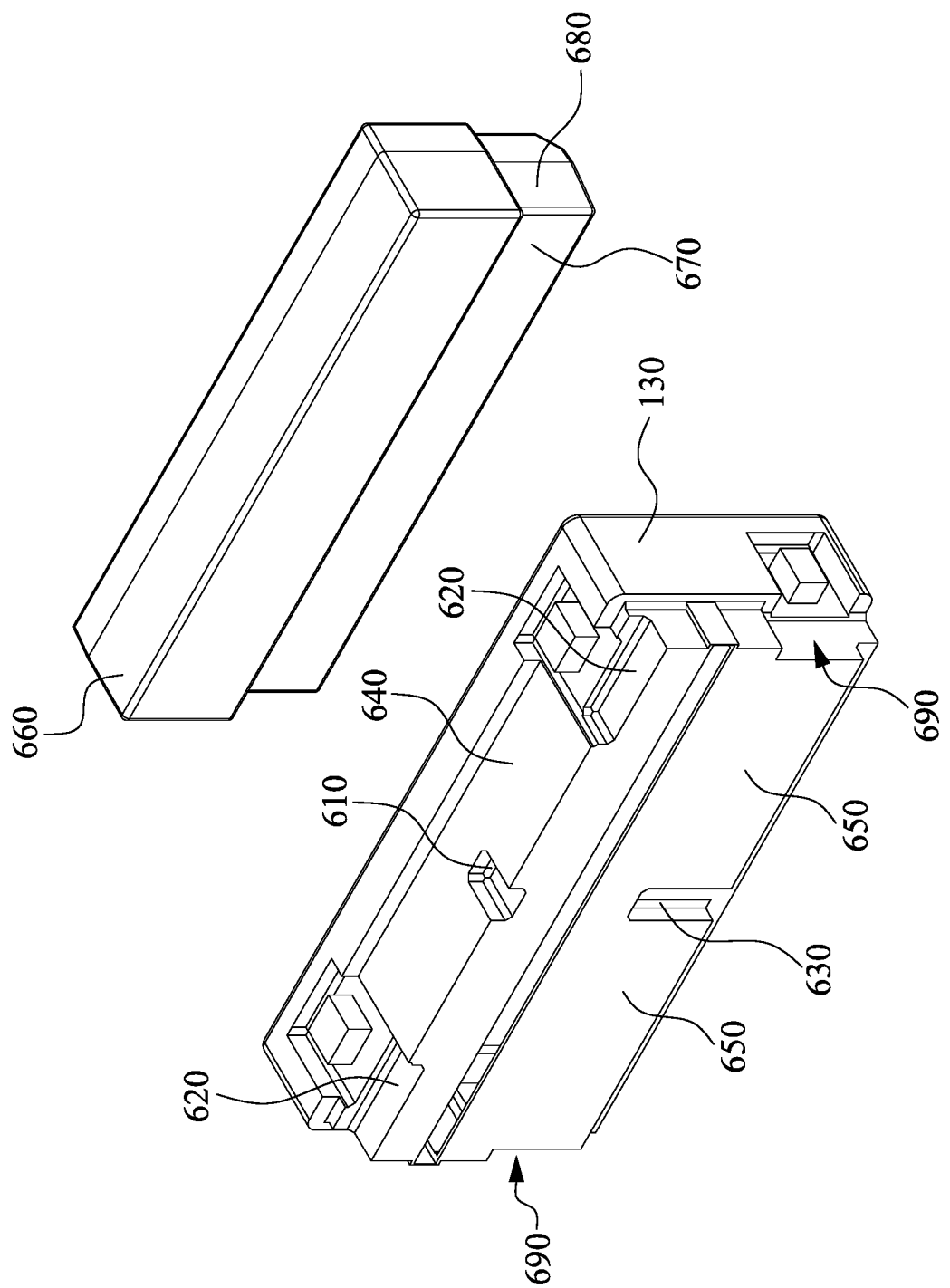
FIG. 6 illustrates a schematic perspective diagram showing a molded bonding layer and an inner film of the high speed wire end connector according to one embodiment of the present invention.
Figure 7:
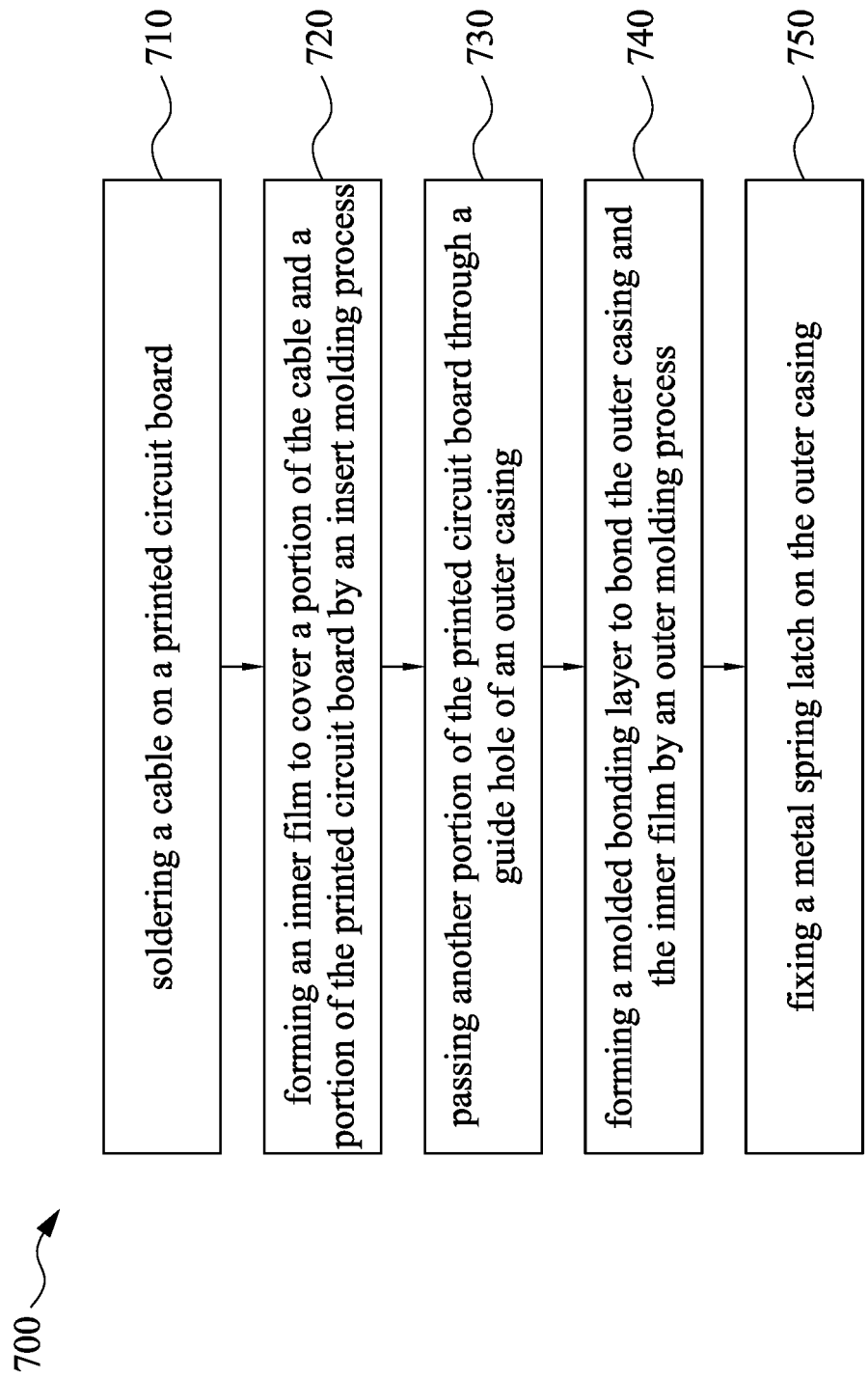
FIG. 7 illustrates a process diagram showing a high speed wire end connector manufacturing method according to another aspect of the present invention.

Refer to FIGS. 1-7. FIG. 1 illustrates a schematic perspective diagram showing a high speed wire end connector according to one embodiment of the present invention, FIG. 2 illustrates an exploded diagram thereof, FIG. 3 illustrates a rear view thereof, FIG. 4 illustrates a partial sectional view thereof, FIG. 5 illustrates a schematic perspective diagram showing an outer casing thereof, FIG. 6 illustrates a schematic perspective diagram showing a molded bonding layer and an inner film thereof, and FIG. 7 illustrates a process diagram showing a high speed wire end connector manufacturing method according to another aspect of the present invention.

Simultaneously referring to FIGS. 1-7, a high speed wire end connector manufacturing method 700 according to one embodiment of the present invention includes the following steps. First, step 710, see FIG. 2, a cable 150 is soldered on a printed circuit board 140. Then, in step 720, an insert molding process is conducted to form an inner film 210 for covering a portion of the cable 150 and a portion of the printed circuit board 140, and solder joints of the cable 150 and the printed circuit board 140 are covered by the inner film 210.

In step 730, another portion of the printed circuit board 140 passes through a guide hole 117 an outer casing 110. Referring to FIG. 5, the interior of the outer casing 110 includes a plurality of limit protrusions to limit the inner film 210 between the limit protrusions of the outer casing 110, for example, between a first limit protrusion 510, a second limit protrusion 520, a third limit protrusion 530 and a fourth limit protrusion 560 to ensure the relative positions of the inner film 210 and the outer casing 110. While the relative positions of the inner film 210 and the outer casing 110 are fixed, the related components of the high speed wire end connector 100 can be effectively fixed.

For example, the first limit protrusion 510 and the second limit protrusion 520 are disposed on the bottom surface of a fixing tongue 112 and parallel with the surface of the printed circuit board 140 to ensure the height of the inner film 210. The third limit protrusion 530 is disposed under the guide hole 117 to ensure a protruding length of the printed circuit board 140 from the guide hole 117. The fourth limit protrusions 560 are disposed on the left and right sides of the outer casing 110 to ensure the relative positions of the printed circuit board 140 on the left and right sides within the outer casing 110. In addition, adhesive recesses 540 and adhesive recesses 550 can be formed between the outer casing 110 and the inner film 210 with the limit protrusions.

In some embodiments, referring to step 730, the step of passing another portion of the printed circuit board 140 through the guide hole 117 of the outer casing 110 can further utilize at least one positioning pin to fix the inner film 210 between the limit protrusions of the outer casing 110.

After the inner film 210, the printed circuit board 140 and the cable 150 are positioned in the opening inside the outer casing 110, in step 740, a molded bonding layer 130 is formed by an outer molding process 220 to bond to the outer casing 110, the inner film 210, the printed circuit board 140 and the cable 150 to precisely fix the related components of the high speed wire end connector 100.

In some embodiments, the high speed wire end connector manufacturing method 700 further includes the step 750 of fixing a metal spring latch 120 on the outer casing 110.

In addition, a high speed wire end connector 100 according to another aspect of the present invention includes a printed circuit board 140, a cable 150, an inner film 210, an outer casing 110 and a molded bonding layer 130. The cable 150 is soldered on the printed circuit board 140 to electrically connect to the metal terminals 142 on the printed circuit board 140.

In some embodiments, the cable 150 has a 90 degree angle and is soldered on the printed circuit board 140.

In addition, the inner film 210 covers a portion of the cable 150 and a portion of the printed circuit board 140 to protect the solder joints of the cable 150 and the printed circuit board 140 so as to improve the service life of the high speed wire end connector 100.

The outer casing 110 can protect portions of the inner film 210, the cable 150 and the printed circuit board 140 inside the outer casing 110 and couple to a corresponding board-end connector. In addition, another portion of the printed circuit board 140 passes through a guide hole 117 of the outer casing 110 to allow metal terminals 142 of the printed circuit board 140 able to electrically connect to the corresponding board-end connector. Additionally, the molded bonding layer 130 can effectively bond to the outer casing 110 to the inner film 210, and precisely and stably fix the outer casing 110, the inner film 210, the cable 150 and the printed circuit board 140 to provide a better water proof capability of the high speed wire end connector 100 and improve the quality of the high speed wire end connector 100.

In some embodiments, the high speed wire end connector 100 further includes a metal spring latch 120 fixed in the spring latch fixing device 113 of the outer casing 110 to engage with a positioning opening of the corresponding board-end connector.

In some embodiments, the outer casing 110 includes a fixing tongue 112, and the metal spring latch 120 fixes in the spring latch fixing device 113 on the fixing tongue 112.

In some embodiments, the outer casing 110 further includes a U-shaped protection 114, and the U-shaped protection 114 and the fixing tongue 112 surround the printed circuit board 140 to protect the printed circuit board 140 and provides a stable and secure connection when the high speed wire end connector 100 is coupled to the corresponding board end connector.

In some embodiments, the outer casing 110 further includes a plurality of limit protrusions, e.g. a first limit protrusion 510 and a second limit protrusion 520 corresponding to a first surface 660 of the inner film 210. The first surface 660 of the inner film 210 is approximately parallel to a surface of the printed circuit board 140. Hence, the first limit protrusion 510 and the second limit protrusion 520 can effectively limit the relative heights of the inner film 210 and the outer casing 110.

In some embodiments, the outer casing 110 further includes another protrusion, e.g. a third limit protrusion 530 corresponding to a second surface 670 of the inner film 210, and the second surface 670 is about perpendicular to the surface of the printed circuit board 140 so as to ensure a length of the printed circuit board 140 protruding from the guide hole 117.

In some embodiments, the outer casing 110 further includes further another protrusions, e.g. fourth limit protrusions 560 disposed on both left and right sides of the interior opening of the outer casing 110 to ensure the relative positions of the printed circuit board 140 and the outer casing 110 on the left and right sides. The fourth limit protrusion 560 is corresponding to a third surface 680 of the inner film 210 and the third surface 680 is approximately perpendicular to the surface of the printed circuit board 140 and the second surface 670.

In some embodiments, the molded bonding layer 130 includes a plurality of adhesive grooves, e.g. a first adhesive groove 610 corresponding to the first limit protrusion 510, a second adhesive groove 620 corresponding to the second limit protrusion 520, a third adhesive groove 630 corresponding to the third limit protrusion 530 and a fourth adhesive groove 690 corresponding to the fourth limit protrusion 560.

In some embodiments, the molded bonding layer 130 includes a plurality of adhesive bumps, e.g. adhesive bumps 640 and adhesive bumps 650 to effectively bond to adhesive recesses 540 and adhesive recesses 550 of the outer casing 110. With the adhesive recesses 540 and the adhesive recesses 550, the material of the molded bonding layer 130 can more easily flow in the space during the outer molding process 220, and the adhesion strength of the molded bonding layer 130 bonding to the outer casing 110 and the inner film 210 can be effectively improved as well as the water proof capability of the high speed wire end connector 100 is also improved.

In some embodiments, the outer casing 110 further includes a plurality of adhesive lugs 115, and the molded bonding layer 130 further includes a plurality of adhesive grooves 135 to bond to corresponding adhesive lugs 115.

In some embodiments, the adhesive lugs 115 further include openings 116 and the molded bonding layer 130 further includes a plurality of adhesive bumps 136 to respectively bond to corresponding opening 116.

In some embodiments, the molded bonding layer 130 further includes at least one positioning hole 310 to expose the inner film 210 so that a positioning pin can fix the inner film 210 between the limit protrusions of the outer casing 110 during the outer molding process 220.

In some embodiments, the outer casing 110 further includes a sliding channel 570 to allow the printed circuit board 140 sliding into the guide hole 117 of the outer casing 110.

Accordingly, the high speed wire end connector manufacturing by the high speed wire end connector manufacturing method can provide an outer casing produced by plastic injection process to couple to the printed circuit board so that the length of the printed circuit board can be reduced and the positioning accuracy and water proof capability can be improved with the inner film, the molded bonding layer and the limit protrusions of the outer casing, the total product quality of the high speed wire end connector is also improved, and the transmission rate and the transmission quality of the high speed wire end connector are also improved.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A high speed wire end connector, comprising:
a printed circuit board;
a cable soldering on the printed circuit board;
an inner film covering a portion of the cable and a portion of the printed circuit board;
an outer casing fixing the printed circuit board, the cable and the inner film, wherein another portion of the printed circuit board passes through a guide hole of the outer casing; and a molded bonding layer bonding to the outer casing and the inner film, wherein the outer casing further comprises a plurality of adhesive lugs, and the molded bonding layer further comprises a plurality of adhesive grooves to bond to corresponding adhesive lugs, wherein the adhesive lugs further comprise openings and the molded bonding layer further comprises a plurality of adhesive bumps to bond to corresponding openings, wherein the molded bonding layer further comprises at least one positioning hole to expose the inner film.

2. The high speed wire end connector of claim 1, further comprising a metal spring latch fixing on the outer casing.

3. The high speed wire end connector of claim 2, wherein the outer casing further comprises a fixing tongue and the metal spring latch is fixed on the fixing tongue.

4. The high speed wire end connector of claim 3, wherein the outer casing further comprises a U-shaped protection, and the U-shaped protection and the fixing tongue surround the printed circuit board.

5. The high speed wire end connector of claim 4, wherein the outer casing further comprises a plurality of limit protrusions to limit the inner film in the outer casing.

6. The high speed wire end connector of claim 5, wherein the molded bonding layer comprises a plurality of adhesive grooves to bond to corresponding limit protrusions.

7. The high speed wire end connector of claim 6, wherein the outer casing further comprises a plurality of adhesive recesses formed between the limit protrusions to bond to adhesive bumps of the molded bonding layer.

8. The high speed wire end connector of claim 7, wherein the limit protrusions comprise at least one first limit protrusion and at least one second limit protrusion corresponding to a first surface of the inner film, and the first surface of the inner film is parallel to a surface of the printed circuit board.

9. The high speed wire end connector of claim 8, wherein the limit protrusions further comprise a third limit protrusion corresponding to a second surface of the inner film, and the second surface is perpendicular to the surface of the printed circuit board.

10. The high speed wire end connector of claim 9, wherein the limit protrusions further comprise at least one fourth limit protrusion corresponding to a third surface of the inner film, and the third surface is perpendicular to the surface of the printed circuit board and the second surface.

11. The high speed wire end connector of claim 1, wherein the outer casing further comprises a sliding channel to allow the printed circuit board sliding into the guide hole of the outer casing.

* * * * *